US008172291B2

(12) United States Patent
Hebiishi

(10) Patent No.: US 8,172,291 B2
(45) Date of Patent: May 8, 2012

(54) SUBSTRATE TRANSPORT APPARATUS AND SUBSTRATE TRANSPORT METHOD

(75) Inventor: Hiroyasu Hebiishi, Tokyo (JP)

(73) Assignee: Olympus Corporation, Tokyo (JP)

(*) Notice: Subject to any disclaimer, the term of this patent is extended or adjusted under 35 U.S.C. 154(b) by 168 days.

(21) Appl. No.: 12/619,873

(22) Filed: Nov. 17, 2009

(65) Prior Publication Data
US 2010/0135761 A1 Jun. 3, 2010

(30) Foreign Application Priority Data

Dec. 2, 2008 (JP) ................................ 2008-307375

(51) Int. Cl.
*A47J 45/00* (2006.01)
(52) U.S. Cl. ............. 294/183; 29/65; 414/941; 294/213
(58) Field of Classification Search ................. 294/64.1, 294/183, 65, 213; 414/941; 901/40
See application file for complete search history.

(56) References Cited

U.S. PATENT DOCUMENTS
7,572,742 B2  8/2009  Hiroki

FOREIGN PATENT DOCUMENTS
| CN | 1922725 A | 2/2007 |
| JP | 10-022364 A | 1/1998 |
| JP | 10022364 A * | 1/1998 |
| JP | 10-146784 A | 6/1998 |
| JP | 11-268829 A | 10/1999 |
| JP | 2001-277169 A | 10/2001 |
| JP | 2003-051525 A | 2/2003 |
| JP | 2003-068824 A | 3/2003 |
| JP | 2005-093893 A | 4/2005 |
| JP | 2005093893 A * | 4/2005 |
| JP | 2006-310709 A | 11/2006 |
| WO | WO 2007/119613 A1 | 10/2007 |

OTHER PUBLICATIONS

Japanese Office Action dated Oct. 19, 2010 in counterpart Japanese Application No. 2008-307375.
Chinese Office Action dated Jul. 27, 2011 in counterpart Chinese Application No. 200910250135.2.
Chinese Office Action dated Nov. 8, 2011 (and English translation of the relevant parts thereof) in counterpart Chinese Application No. 200910250135.2.
Korean Office Action dated Nov. 17, 2011 (and English translation of the relevant parts thereof) in counterpart Korean Application No. Oct. 2009-0113881.

* cited by examiner

*Primary Examiner* — Saul Rodriguez
*Assistant Examiner* — Gabriela Puig
(74) *Attorney, Agent, or Firm* — Holtz, Holtz, Goodman & Chick, PC

(57) ABSTRACT

A substrate transport apparatus includes: a pair of arm units having a substrate-carrying surface on which a substrate is placed; a support member freely rotatably supporting the arm unit; and an inclination device inclining the arm unit with each of the substrate-carrying surface facing one another.

16 Claims, 20 Drawing Sheets

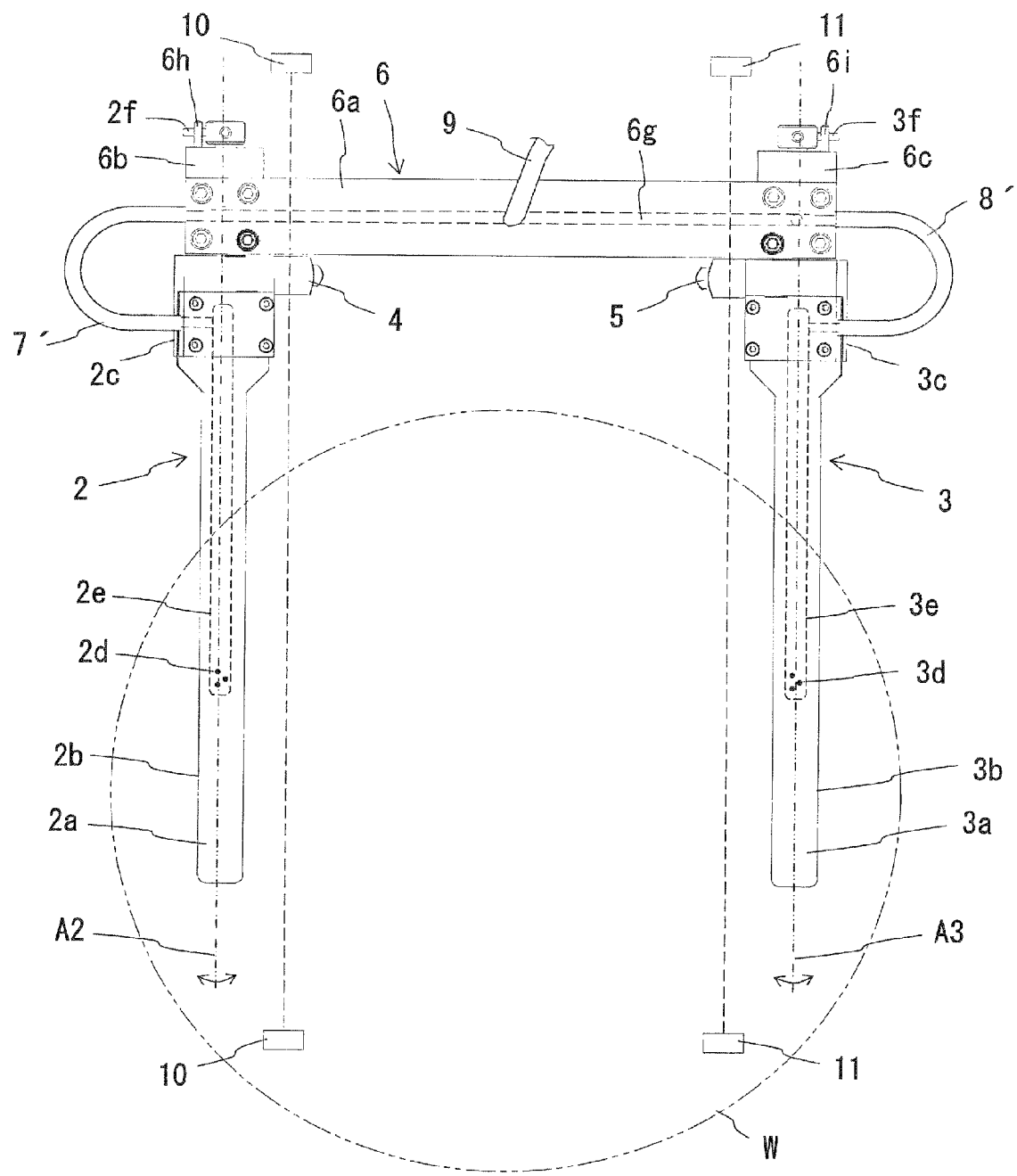
F I G. 12

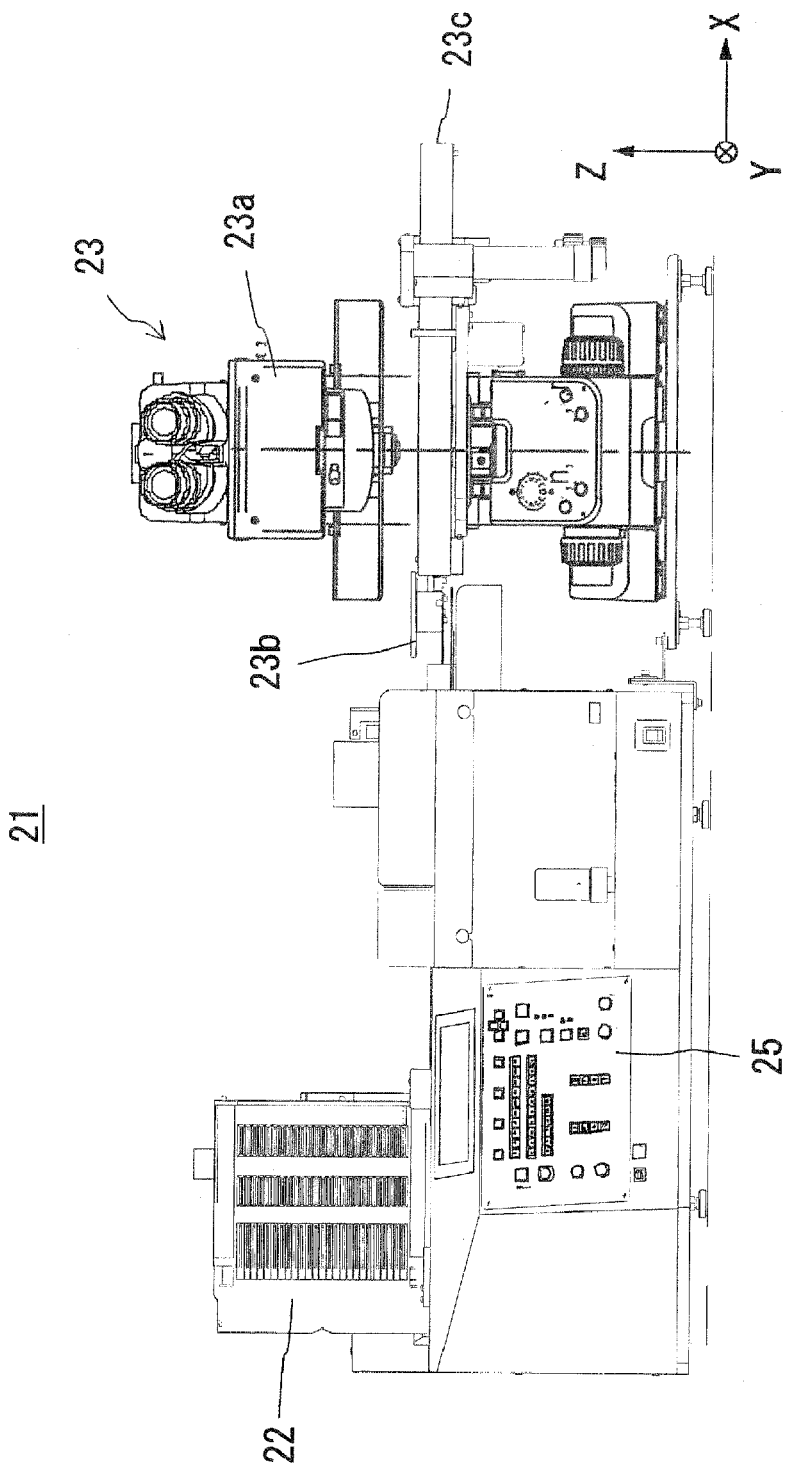
F I G. 17

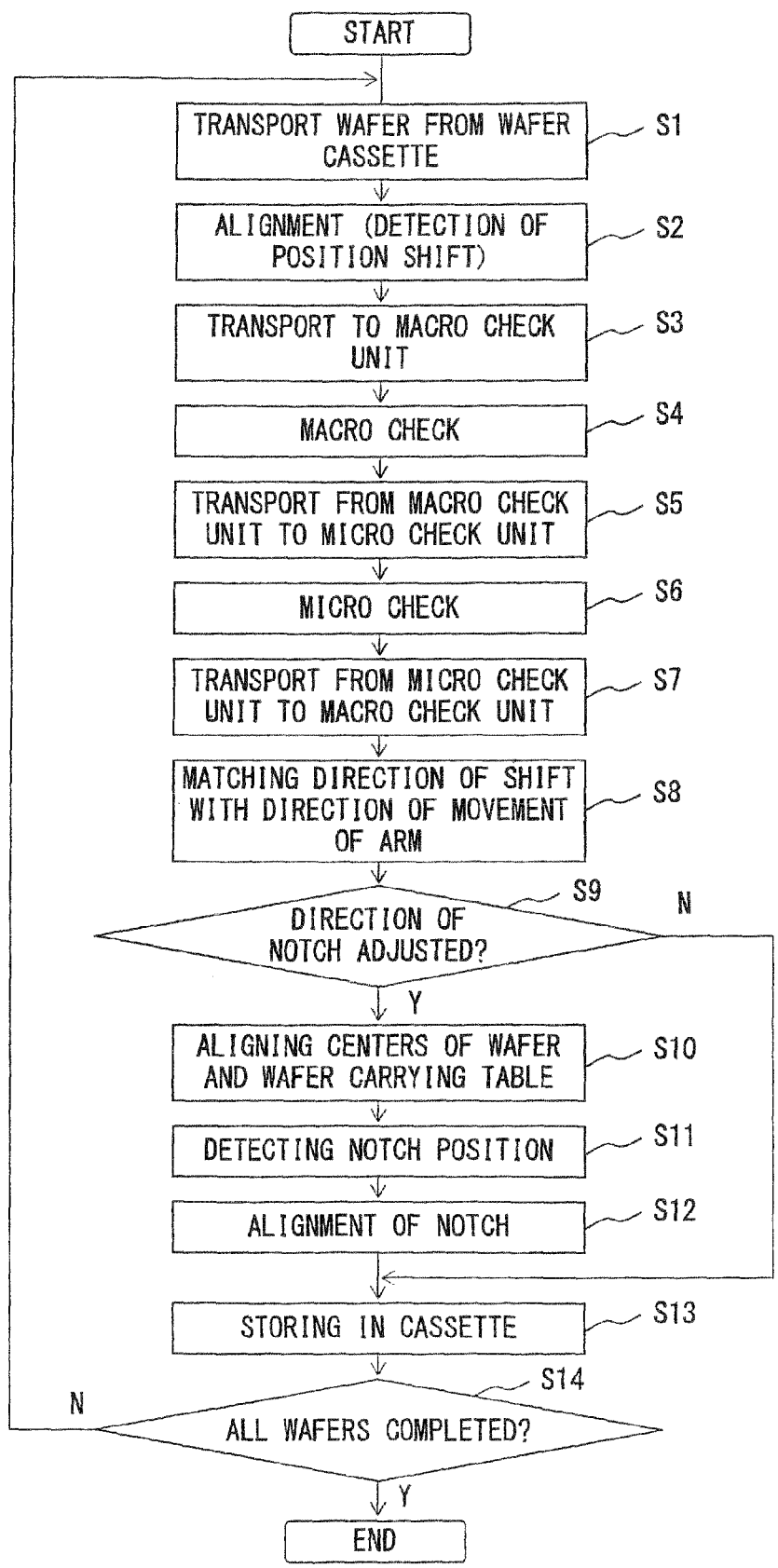
F I G. 1 8

SUBSTRATE TRANSPORT APPARATUS AND SUBSTRATE TRANSPORT METHOD

CROSS REFERENCE TO THE RELATED APPLICATION

This application is based upon and claims the benefit of priority from the prior Japanese Patent Application No. 2008-307375, filed Dec. 2, 2008, the entire contents of which are incorporated herein by reference.

BACKGROUND OF THE INVENTION

1. Field of the Invention

The present invention relates to a substrate transport apparatus and a substrate transport method using an arm unit onto which a substrate is loaded.

2. Description of the Related Art

Recently, a thinner substrate such as a wafer etc. used in producing a semiconductor, and a larger substrate such as a flat panel display etc. including a liquid crystal display etc. have been used. Under the circumstances, substrates are easily warped and deformed. Therefore, when a warped and deformed substrate is placed on an arm unit in a horizontal state, the space arises between the substrate and the arm unit.

Therefore, a wafer transport device has been proposed to keep a wafer parallel to a support bar by the support bar (arm unit) for supporting the wafer contacting the wafer so that the support bar can be inclined (for example, the Patent Document 1).

[Patent Document 1] Japanese Laid-open Patent Publication No. 2005-93893.

SUMMARY OF THE INVENTION

The substrate transport apparatus according to the present invention is provided with: a pair of arm units having a substrate-carrying surface on which a substrate is placed; a support member freely rotatably supporting the arm unit; and an inclination device inclining the arm unit with each of the substrate-carrying surface facing one another.

Another substrate transport apparatus according to the present invention is provided with: a pair of arm units having a substrate-carrying surface on which a substrate is placed.; a support member freely rotatably supporting the arm unit; and an inclination device inclining the arm unit with each of the substrate-carrying surface facing one another. The substrate-carrying surface rotates about the rotation axis positioned on the substrate-carrying surface.

The substrate transport method according to the present invention transports a substrate with the substrate placed on an arm unit. The arm unit having the substrate-carrying surface inclined toward the horizontal plane is moved to the position where the substrate is placed, and the substrate is placed on the inclined arm unit.

BRIEF DESCRIPTION OF THE DRAWINGS

FIG. 12 is a plan view of the wafer transport device according to the third variation example of an embodiment of the present invention;

FIG. 17 is a front view of the wafer check device according to an embodiment of the present invention; and FIG. 18 is a flowchart of the wafer check method according to an embodiment of the present invention.

DESCRIPTION OF THE EMBODIMENTS

The substrate transport apparatus, the substrate check device, and the substrate transport method according to an embodiment of the present invention are described below with reference to the attached drawings using a wafer for example as a substrate.

<Relating to Wafer Transport Device and Wafer Transport Method>

Figure 1:
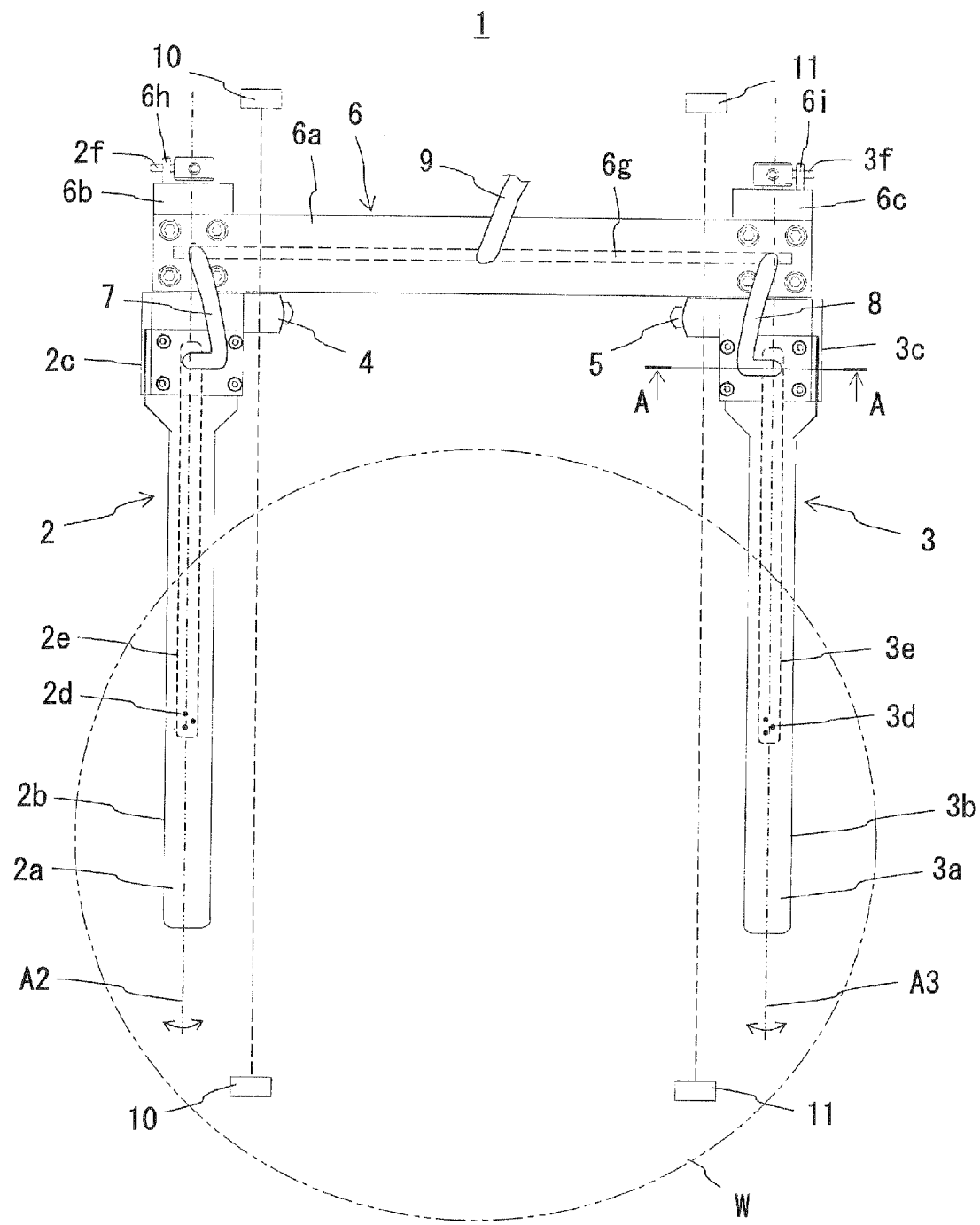
FIG. 1 is a plan view of the wafer transport device according to an embodiment of the present invention.
Figure 4:
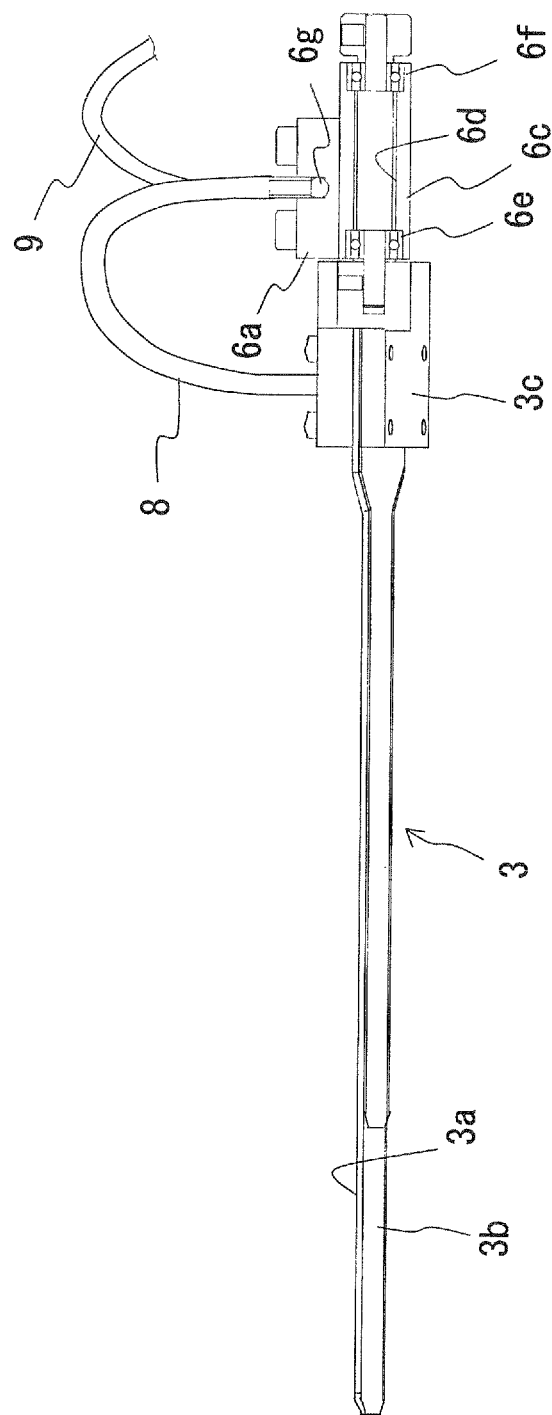
FIG. 4 is a right side view of the partial section of the wafer transport device according to an embodiment of the present invention.
Figure 5:
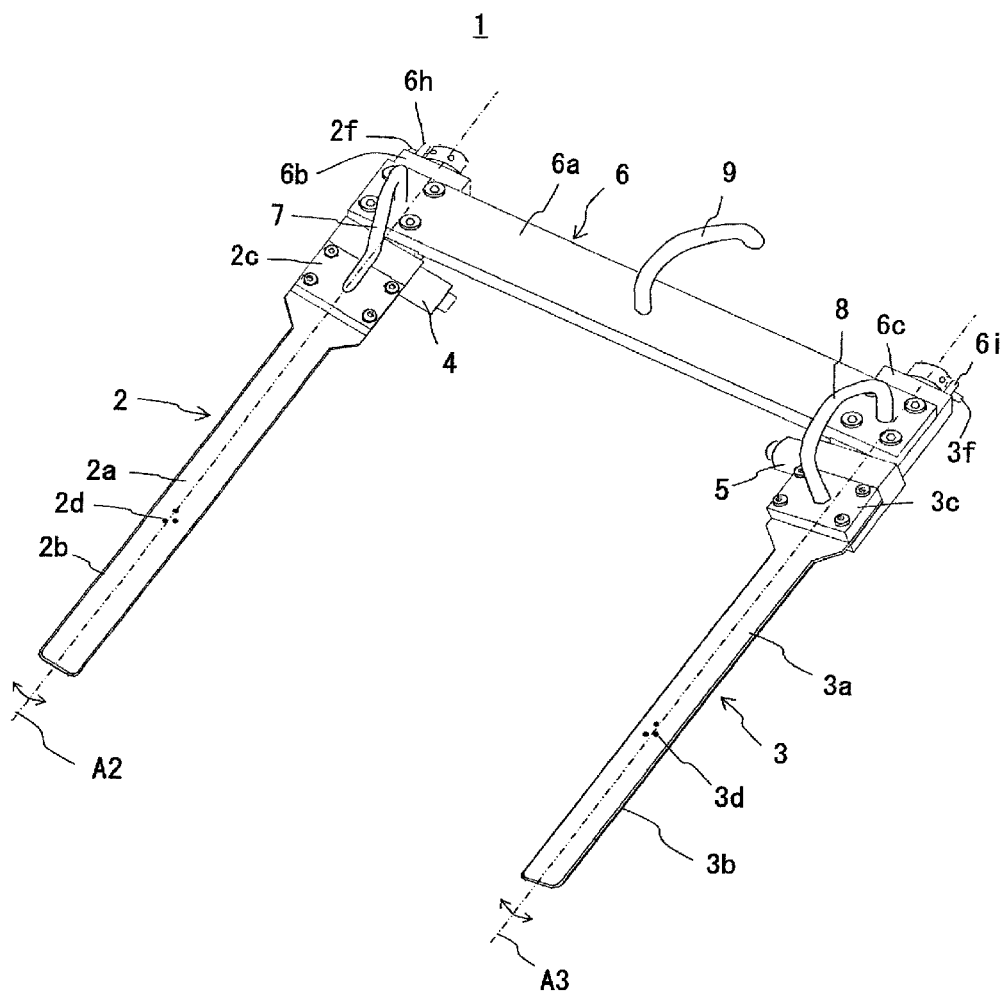
FIG. 5 is a perspective view of the wafer transport device according to an embodiment of the present invention.
Figure 6:
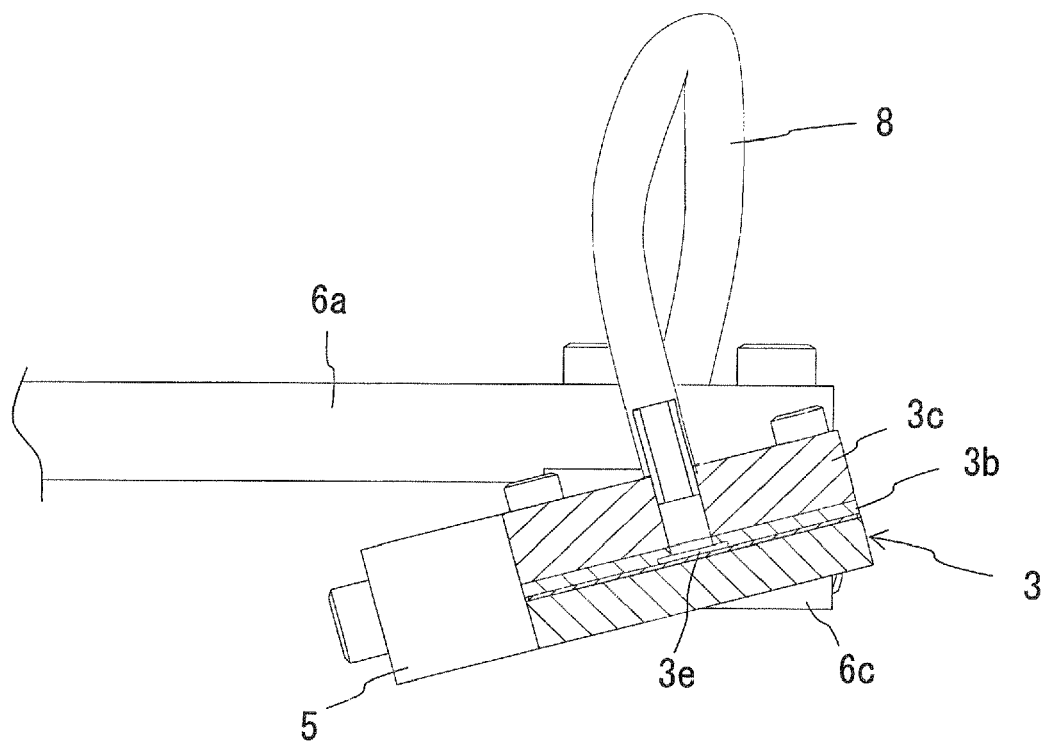
FIG. 6 is a A-A sectional view of FIG. 1.

FIGS. 1 through 5 are a plan view, a front view, a back view, a right side view of the partial section and a perspective view FIG. 6 is an A-A sectional view in FIG. 1.

The wafer transport device 1 is provided with a pair of arm units 2 and 3 having wafer carrying surfaces 2a and 3a onto which a wafer W is loaded and set parallel to each other, and ballasts (cops) 4 and 5 as inclination devices for inclining the wafer carrying surfaces 2a and 3a (arm units 2 and 3) toward the horizontal plane with the longitudinal direction of the arm units 2 and 3 set as rotation axes A2 and A3. The wafer transport device 1 is also provided with the arm units 2 and 3 on the right and left, an arm support unit 6 as a support member for supporting the arm units 2 and 3 so that they can be freely rotated, arm side suction tubes 7 and 8 as suction tubes, a support unit side suction tube 9, and transmission sensors 10 and 11 (illustrated in FIGS. 1 and 2) as inclination detection device.

The wafer transport device 1 has the arm support unit 6 connected to a robot etc. having a multi-joint arm as a drive device not illustrated in the attached drawings, and the wafer W, and has a wafer W so that it can be transported in the horizontal and vertical directions.

The arm units 2 and 3 are provided with carrying plates 2b and 3b having the wafer carrying surfaces 2a and 3a on the respective tops and plate fixing units 2c and 3c for enclosing and fixing the carrying plates 2b and 3b.

As illustrated in FIG. 4 (right side view), the arm units 2 and 3 pass through a through hole 6d (only the view of the axis support unit 6c is illustrated) formed in axis support units 6b and 6c of the arm support unit 6 as described later. The axes of the arm units 2 and 3 are supported by two bearings 6e and 6f which are arranged on the both ends of the through hole 6d to be rotatable about the rotation axes A2 and A3 extending horizontally and parallel to each other as illustrated in FIGS. 1 and 5.

In the wafer carrying surfaces 2a and 3a on the carrying plates 2b and 3b, a plurality of suction holes 2d and 3d are formed to adsorb to and hold the wafer W as illustrated in FIGS. 1 and 5. The suction holes 2d and 3d are connected to the suction paths 2e and 3e illustrated in FIG. 1 formed inside the arm units 2 and 3. The suction paths 2e and 3e are connected to the arm side suction tubes 7 and 8.

The arm side suction tubes 7 and 8 are formed by a flexible material such as silicon etc., and connected to the plate fixing units 2c and 3c of the arm units 2 and 3 on the rotation axes A2 and A3 in the direction orthogonal to the rotation axes A2 and A3 according to the present embodiment as a direction different from the direction of the rotation axes A2 and A3 of the wafer carrying surfaces 2a and 3a. The end portion opposite the arm units 2 and 3 of the arm side suction tubes 7 and 8 are connected to the arm support unit 6.

The end portion opposite the carrying plates 2b and 3b of the arm units 2 and 3 is provided with arm side pins (rotation restriction device) 2f and 3f for restricting the rotation angle of the arm units 2 and 3 by contacting rotation restriction pins (rotation restriction device) 6h and 6i of the arm support unit 6 as described later.

Figure 2:
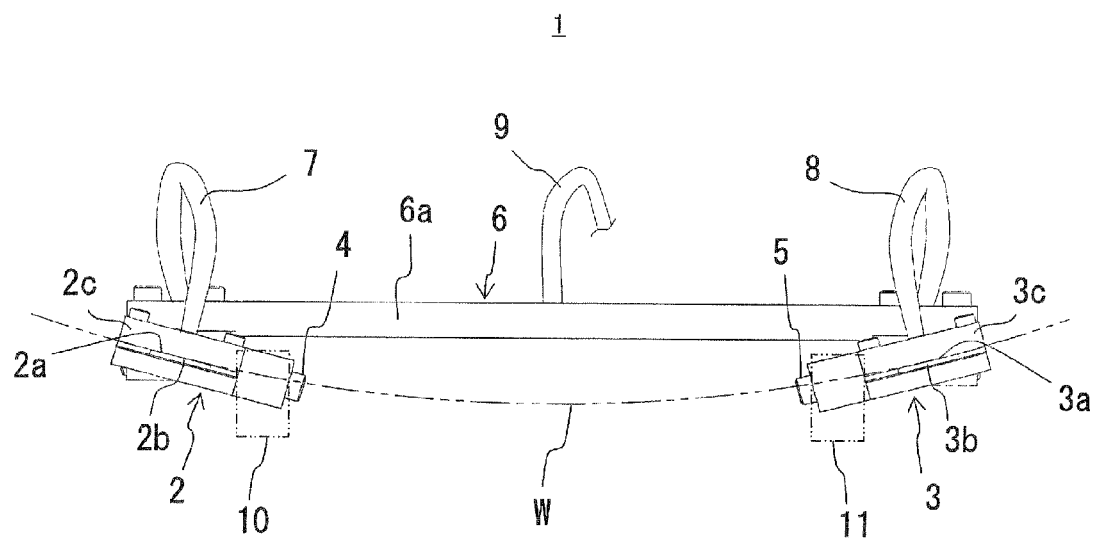
FIG. 2 is a front view of the wafer transport device according to an embodiment of the present invention.
Figure 3:
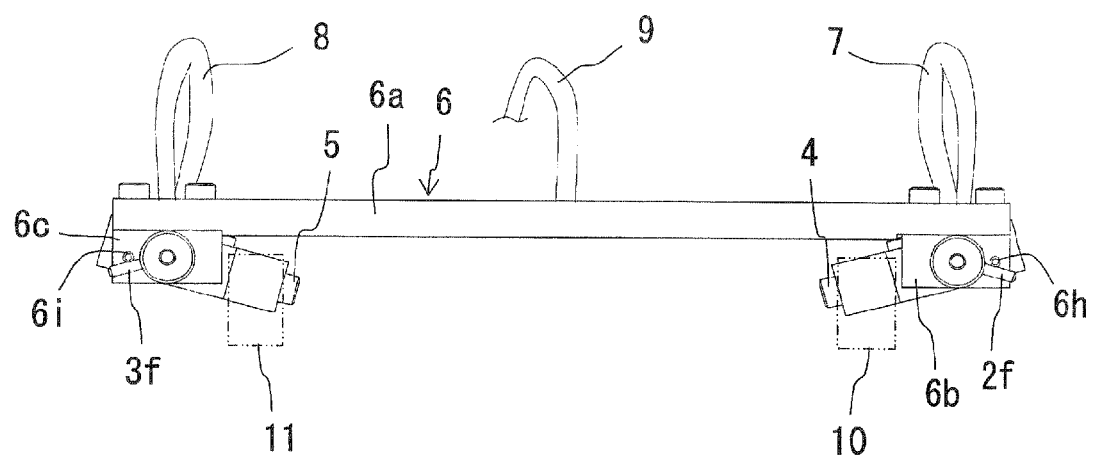
FIG. 3 is a back view of the wafer transport device according to an embodiment of the present invention.

The arm units 2 and 3 are urged into the state in which the wafer carrying surfaces 2a and 3a are inclined into the horizontal plane by arranging the ballasts 4 and 5 inside (space side between the arm units 2 and 3) the plate fixing units 2c and 3c of the arm units 2 and 3. Thus, as illustrated in FIG. 2, the wafer carrying surfaces 2a and 3a of the arm units 2 and 3 can be inclined so that they can be parallel to the wafer W warped upward from the center to the periphery, that is, in the direction in which the respective wafer carrying surfaces 2a and 3a can face each other. The inclination state can be urged by shifting the rotation axis from the barycenter position of the arm units 2 and 3 to the outside of the two arm units 2 and 3.

The arm support unit 6 is provided with a support plate 6a extending in the direction perpendicular to the rotation axes A2 and A3 of the arm units 2 and 3, and the axis support units 6b and 6c fixed to the lower parts of both ends of the support plate 6a, and having the through hole 6d. However, the axis support units 6b and 6c is not only fixed to the lower parts of both ends, but also can be fixed to the upper part, side part, etc. of the support plate 6a.

A suction path 6g extending in the longitudinal direction of the support plate 6a is formed inside the support plate 6a, and the arm side suction tubes 7 and 8 and the support unit side suction tube 9 are connected to the support plate 6a so that they can be connected to the suction path 6g.

Like the arm side suction tubes 7 and 8, the support unit side suction tube 9 is formed by a flexible material, and is connected to the suction device not illustrated in the attached drawings. The support unit side suction tube 9 can be a hard tube such as metal etc. as necessary. The suction path can also be configured by using hollow members. The suction device holds the adsorption of the wafer W to the wafer carrying surfaces 2a and 3a by the suction of air through the suction path 6g of the arm support unit 6, the arm side suction tubes 7 and 8, the suction paths 2e and 3e and the suction holes 2d and 3d of the arm units 2 and 3.

The rotation restriction pins 6h and 6i is provided for the arm support unit 6 to regulate the rotation angle of the wafer carrying surfaces 2a and 3a by extending from the axis support units 6b and 6c parallel with the rotation axes A2 and A3 of the arm units 2 and 3 and contacting the arm side pins 2f and 3f. The rotation restriction pins 6h and 6i can attach to and detach from a plurality of positions of the axis support units 6b and 6c, and can adjust the rotation range of the arm units 2 and 3 by changing the attachment positions.

The transmission sensors 10 and 11 emit detection beams parallel to the rotation axes A2 and A3 of the arm units 2 and 3, and detect whether or not the inclination of the wafer carrying surfaces 2a and 3a have reached a predetermined angle depending on whether or not the detection beams are interrupted by the ballasts 4 and 5.

Figure 7A:
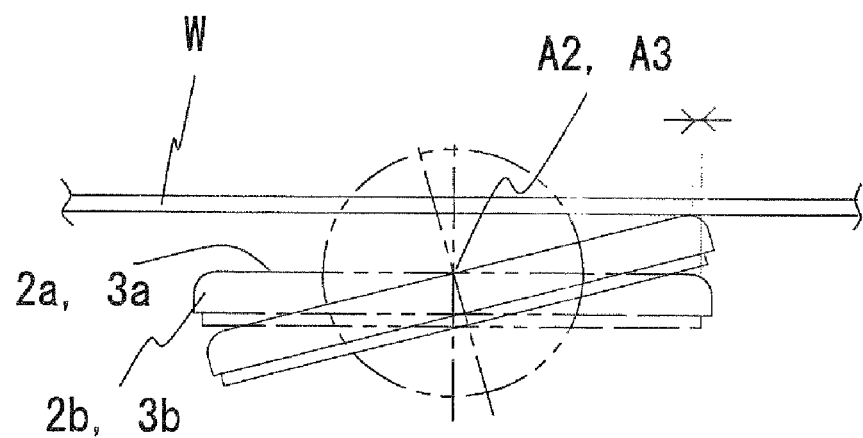
FIG. 7A is an explanatory view of the rotation axis of the arm unit of the wafer transport device according to an embodiment of the present invention.
Figure 7B:
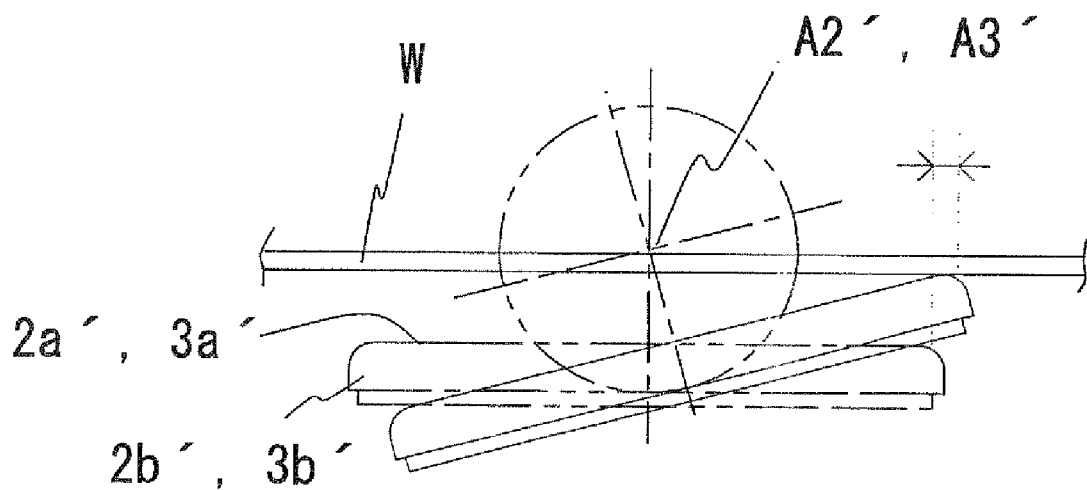
FIG. 7B is an explanatory view (example of comparison) for description of the rotation axis of the arm unit.

FIG. 7A is an explanatory view for description of the rotation axes A2 and A3 of the arm units 2 and 3. FIG. 7B is an example of comparison.

As illustrated in FIG. 7A, the rotation axes A2 and A3 of the carrying plates 2b and 3b (arm units 2 and 3) according to the present embodiment are positioned on the wafer carrying surfaces 2a and 3a of the carrying plates 2b and 3b. Therefore, although the carrying plates 2b and 3b rotate while contacting the wafer W, the wafer carrying surfaces 2a and 3a have small amounts of horizontal shift, and there is the slightest horizontal slip with the carrying plates 2b and 3b contacting the wafer W. Therefore, the wafer W can be held by the carrying plates 2b and 3b at a desired position without a position shift of the wafer W or an occurrence of a flaw by the friction with the back of the wafer W.

On the other hand, when the rotation axes A2' and A3' of the carrying plates 2b' and 3b' are apart from the wafer carrying surfaces 2a and 3a, for example, when the rotation axes A2' and A3' are positioned on the wafer W as in the example of the comparison illustrated in FIG. 7B, the wafer carrying surfaces 2a' and 3a' largely move horizontally if the carrying plates 2b' and 3b' rotate while contacting the wafer W, thereby allowing the carrying plates 2b' and 3b' to greatly slip horizontally while contacting the wafer W. Accordingly, it is hard to hold the wafer W by the carrying plates 2b' and 3b' at a desired position, a position shift of the wafer W is easily made as compared with the carrying plates 2b and 3b illustrated in FIG. 7A, and there is a strong possibility of the risk of generating a flaw due to a slip.

Described below is the transport of the wafer W using the wafer transport device 1.

Figure 8A:
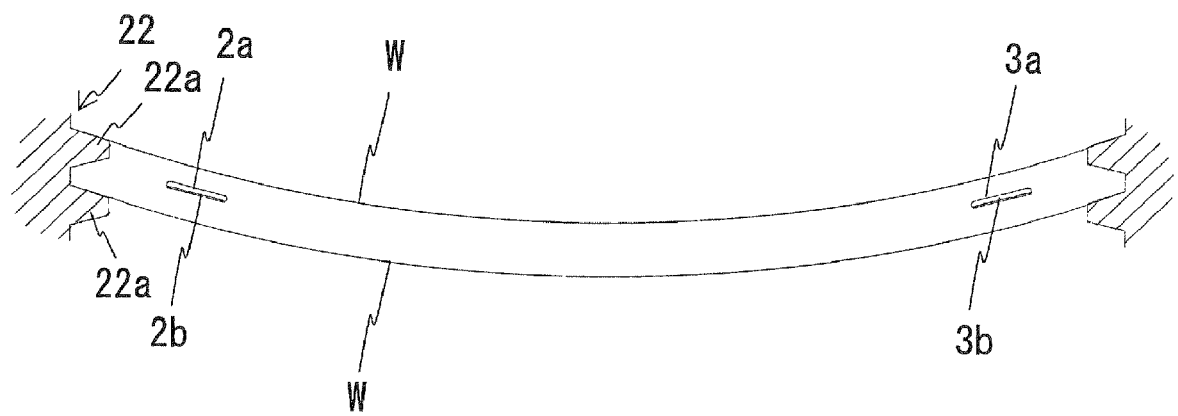
FIG. 8A is an explanatory view (1) for description of conveying a wafer from a wafer cassette by the carrying plate of the wafer transport device according to an embodiment of the present invention.
Figure 8B:
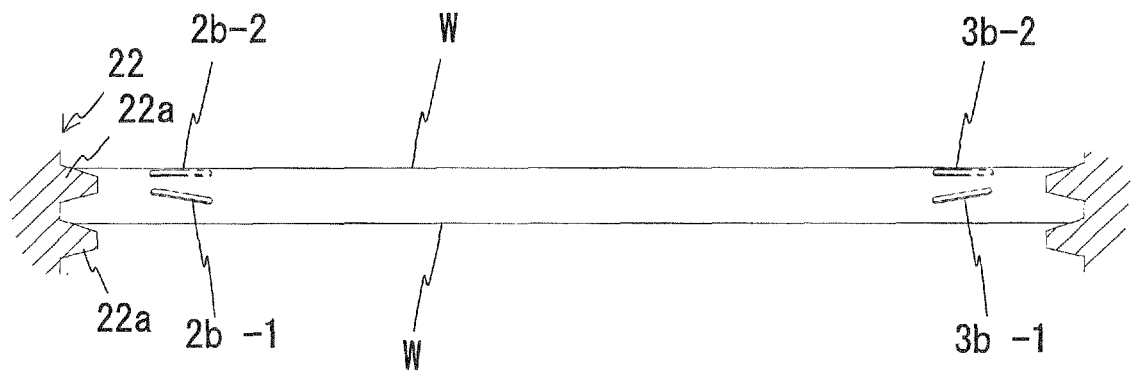
FIG. 8B is an explanatory view (2) for description of conveying a wafer from a wafer cassette by the carrying plate of the wafer transport device according to an embodiment of the present invention.

FIGS. 8A and 8B are explanatory views of the transport of the wafer W from a wafer cassette 22.

The wafer W illustrated in FIG. 8A is piled in the height direction with the periphery supported by a periphery support unit 22a provided in the wafer cassette 22. A plural pieces of piled wafers W are warped upward from the center toward the periphery.

When the wafer W is transported from the wafer cassette 22, the drive device not illustrated in the attached drawings moves the arm units 2 and 3, the arm support unit 6, etc. illustrated in FIGS. 1 through 5 to insert the carrying plates 2b and 3b of the arm units 2 and 3 between the piled wafers W, W.

In this case, the wafer carrying surfaces 2a and 3a of the carrying plates 2b and 3b are inserted between the wafer W, W (where the wafer W is placed) with the surfaces inclined toward the horizontal plane by the above-mentioned ballasts 4 and 5, preferably with the surfaces substantially parallel to the vicinity of the periphery of the wafer W.

Thus, since the wafer carrying surfaces 2a and 3a (carrying plates 2b and 3b) are rotated and inclined by the rotation axes A2 and A3 in the longitudinal direction, there can be a large cap between the carrying plates 2b and 3b an the wafer W, W. Therefore, the carrying plates 2b and 3b can be prevented from contacting the wafer W, W during the insertion. On the other hand, when the carrying plates 2b and 3b having the horizontal wafer carrying surfaces 2a and 3a are inserted between the wafer W, W, there cannot be a large gap between the carrying plates 2b and 3b and the wafer W, W, thereby allowing the plates to easily contact the wafer W.

By inserting the carrying plates 2b and 3b between the wafer W, W, and then raising the carrying plates 2b and 3b or lowering the wafer cassette 22, the wafer W is placed on the wafer carrying surfaces 2a and 3a. In this case, since the arm units 2 and 3 are supported by the arm support unit 6 so that they can be freely rotated, the arm units 2 and 3 rotate so that the wafer carrying surfaces 2a and 3a can contact the wafer W by the surface by the tare of the wafer or the relative movement between the carrying plate 2b and the wafer cassette 22.

Then, the wafer W piled on the wafer carrying surfaces 2a and 3a is transported to, for example, the check unit etc. After performing a check etc., the wafer is stored in the wafer cassette 22 again.

When a thick wafer W, for example, an exceptional wafer W in the horizontal state as illustrated in FIG. 8B is transported from the wafer cassette 22, carrying plates 2b-1 (2b-2) and 3b-1 (3b-2) inserted in the inclined state rotate in the horizontal state while contacting the wafer W during loading. Therefore, the wafer W can be held without fail.

In the above-mentioned wafer transport device 1, the arm units 2 and 3 are inserted into the wafer cassette 22 (moved to the position where the wafer is placed) with the wafer carrying surfaces 2a and 3a inclined toward the horizontal plane. Therefore, although there is warp or deformation occurring in the wafer W piled in the wafer cassette 22, an unnecessary contact between the arm units 2 and 3 and the wafer W can be avoided. Accordingly, according to the present embodiment, the risk of the damage of the wafer W can be reduced.

In addition, according to the present embodiment, since the ballasts 4 and 5 urge the wafer carrying surfaces 2a and 3a of the arm units 2 and 3 into the inclined state, the wafer carrying surfaces 2a and 3a can be inclined with a simple configuration.

Furthermore, according to the present embodiment, the wafer carrying surfaces 2a and 3a (arm units 2 and 3) rotate about the rotation axes A2 and A3 positioned on the wafer carrying surfaces 2a and 3a. Therefore, although the carrying plates 2b and 3b rotate while contacting the wafer W, the wafer carrying surfaces 2a and 3a hardly move horizontally as described above. Thus, the carrying plates 2b and 3b seldom slip horizontally with the carrying plates 2b and 3b contacting the wafer W, thereby allowing the carrying plates 2b and 3b to hold the wafer W at a desired position. Therefore, a position shift of the wafer W, an occurrence of a flaw in the back of the wafer W, etc. can be avoided.

Since a rotation axis and a tube are connected to the same axis in the technology of the above-mentioned patent document 1 (Japanese Laid-open Patent Publication No. 2005-93893), a generated twisting stress works to easily interrupt the rotation of the arm units 2 and 3. On the other hand, according to the present invention, the arm side suction tubes 7 and 8 are connected to the arm units 2 and 3 in the direction different from the rotation axes A2 and A3 of the wafer carrying surfaces 2a and 3a, that is, in the direction orthogonal to the axes. Therefore, although the arm units 2 and 3 rotate, there hardly occurs resilience by the twisting stress on the arm side suction tubes 7 and 8, thereby allowing the arm units 2 and 3 to smoothly rotate.

In addition, according to the present embodiment, since the arm side suction tubes 7 and 8 connect the arm support unit 6 to the arm units 2 and 3, the adsorption can be held by the two arm units 2 and 3 to the wafer W by connecting a single support unit side suction tube 9 to the suction device not illustrated in the attached drawings. Therefore, the wafer transport device 1 can be realized by a simple configuration.

Furthermore, according to the present embodiment, the wafer transport device 1 is provided with the transmission sensors 10 and 11 for detecting the inclination of the wafer carrying surfaces 2a and 3a. Therefore, it is possible to prevent the wafer carrying surfaces 2a and 3a from being inserted into the wafer cassette 22 at an undesired angle, for example, in the horizontal state. As a result, the damage of the wafer W can be avoided without fail.

According to the present embodiment, the arm side pins 2f and 3f and the rotation restriction pins 6h and 6i are provided for regulating the rotation angle of the wafer carrying surfaces 2a and 3a. Therefore, it is possible to prevent the wafer carrying surfaces 2a and 3a from being inserted into the wafer cassette 22 at an undesired angle, for example, in the horizontal state, thereby avoiding the damage of the wafer W without fail.

In addition, according to the present embodiment, the rotation restriction pins 6h and 6i can be attached to or detached from a plurally of positions of the axis support units 6b and 6c. By changing an attachment position, the moving range of the arm units 2 and 3 can be adjusted. Therefore, the rotation angle of the wafer carrying surfaces 2a and 3a can be regulated depending on the warp and deformation of the wafer W.

Figure 9:
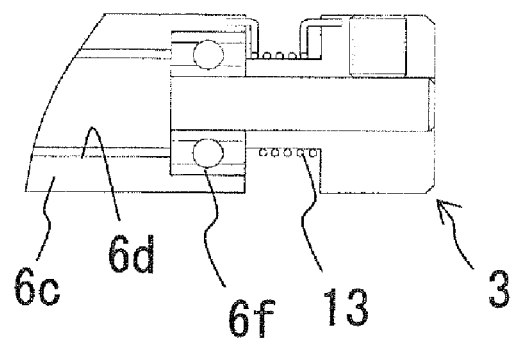
FIG. 9 is a sectional view of the right side of the important portion of the wafer transport device according to the first variation example of an embodiment of the present invention.

Although the example of arranging the ballasts 4 and 5 as inclination devices in the wafer transport device 1 is described above, the ballasts 4 and 5 can be replaced with allowing the wafer carrying surfaces 2a and 3a of the arm units 2 and 3 to be urged into the inclined state using another inclination device such as a coil spring 13 etc. as a spring interposed between the axis support unit 6c (arm support unit 6) and the arm units 2 and 3 as illustrated in FIG. 9 (sectional view of the right side of the important portion).

Furthermore, a drive unit such as a motor etc. for rotating the arm units 2 and 3 can be arranged as an inclination device to incline the arm units 2 and 3, or all the way to the wafer carrying surfaces 2a and 3a by driving the drive unit through the control unit not illustrated in the attached drawings. In this case, the inclination angle of the wafer carrying surfaces 2a and 3a can be adjusted on the basis of the warp and deformation of the wafer W.

Figure 10:
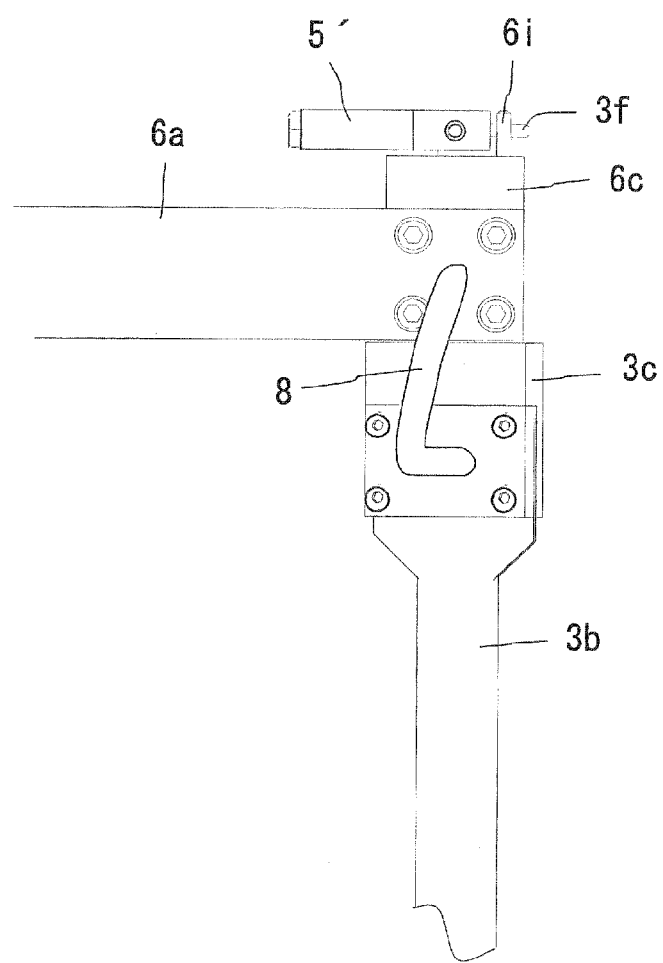
FIG. 10 is a plan view of the important portion of the wafer transport device according to the second variation example of an embodiment of the present invention.
Figure 11:
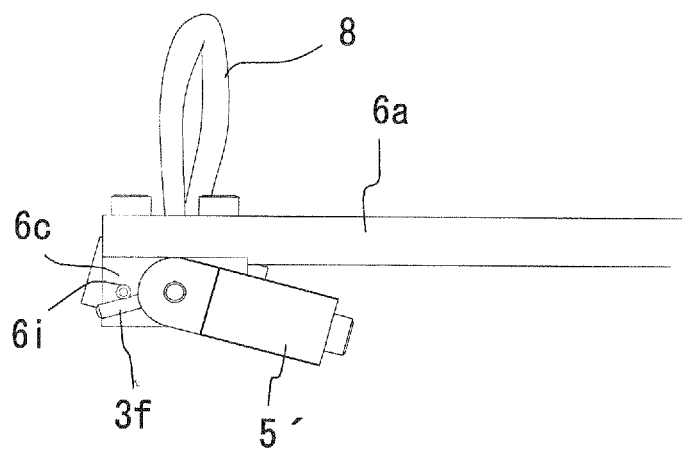
FIG. 11 is a back view of the important portion of the wafer transport device according to the second variation example of an embodiment of the present invention.

In the present embodiment, an example of arranging the ballasts 4 and 5 as inclination devices for the plate fixing units 2c and 3c is described above, but they can also be arranged at the end portion opposite the carrying plates 2b and 3b of the arm units 2 and 3 as a ballast 5' illustrated in FIG. 10 (plan view of the important portion) and FIG. 11 (back view of the important portion).

In addition, according to the present embodiment, the arm side suction tubes 7 and 8 are connected to the arm units 2 and 3 at the top surfaces of the plate fixing units 2c and 3c, but the arm side suction tubes 7' and 8' connected to the arm units 2 and 3 on the sides of the carrying plates 2b and 3b can also be used as illustrated in FIG. 12 (plan view)

Additionally, according to the present embodiment, the arm side suction tubes 7 and 8 are connected to the arm units 2 and 3 on the rotation axes A2 and A3 in the direction orthogonal to the rotation axes A2 and A3 of the wafer carrying surfaces 2a and 3a. Therefore, although the arm units 2 and 3 rotate, there hardly occurs resilience on the arm side suction tubes 7 and 8 by the twisting stress, thereby easily rotating the arm units 2 and 3 with light force without interrupting the urge by the ballasts 4 and 5. If the arm side suction tubes 7 and 8 are connected to the arm units 2 and 3 in the direction different from the rotation axes A2 and A3 of the wafer carrying surfaces 2a and 3a, then it is desired that the direction is nearly orthogonal, but the occurrence of the twisting stress by the arm side suction tubes 7 and 8 can be effectively suppressed.

In addition, according to the present embodiment, the arm side suction tubes 7 and 8 for connecting the arm units 2 and 3 to the arm support unit 6, and the support unit side suction tube 9 for connecting the arm support unit 6 to the suction device not illustrated in the attached drawings are arranged, but a suction tube for directly connecting the arm units 2 and 3 to the suction device can also be arranged. In this case, the suction tube can be connected to the arm units 2 and 3 in the direction different from the rotation axes A2 and A3, and preferably orthogonal to the axes.

In the present embodiment, the arm side suction tubes 7 and 8 are connected to the arm units 2 and 3 on the rotation axes A2 and A3 of the wafer carrying surfaces 2a and 3a, but the arm side suction tubes 7 and 8 can be arranged at the position (not coaxial with the rotation axes A2 and A3, and in the direction not crossing the rotation axes A2 and A3) offset from the rotation axes A2 and A3. In this case, it is also desired that the arm side suction tubes 7 and 8 are connected to the arm units 2 and 3 in the direction different from the rotation axes A2 and A3 of the wafer carrying surfaces 2a and 3a. However, when the tubes are connected to the arm units 2 and 3 in parallel to the rotation axes A2 and A3, the occurrence of the twisting stress in the arm side suction tubes 7 and 8 can be suppressed. Therefore, the arm units 2 and 3 can be rotated with light force.

Figure 13:
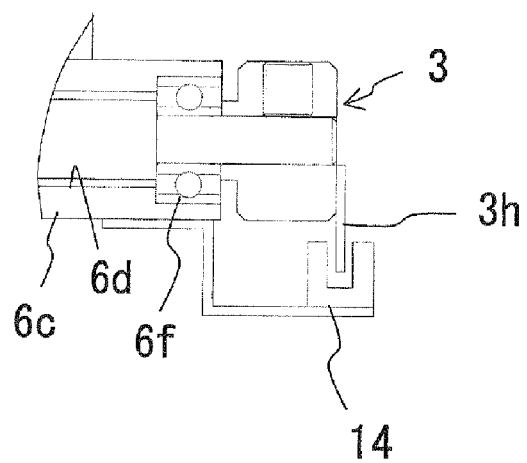
FIG. 13 is a sectional view of the right side of the important portion of the wafer transport device according to the fourth variation example of an embodiment of the present invention.
Figure 14:
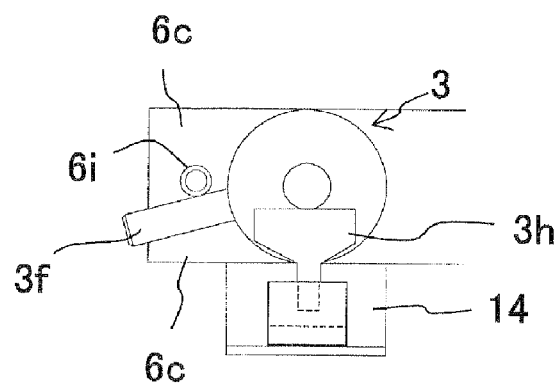
FIG. 14 is a back view of the important portion of the wafer transport device according to the fourth variation example of an embodiment of the present invention.

In addition, according to the present embodiment, the transmission sensors 10 and 11 detect the inclination of the wafer carrying surfaces 2a and 3a depending on whether or not the detection light is interrupted by the ballasts 4 and 5 to determine whether or not the arm units 2 and 3 is inclined to a predetermined angle. However, as illustrated in FIGS. 13 (sectional view of the right side of the important portion) and 14 (back view of the important portion.), an angle detection flag 3h is arranged at the rear end of the angle detection flag 3h, and a transmission sensor 14 for detecting the inclination angle of the wafer carrying surface 3a (2a) depending on whether or not the detection beams are interrupted by the angle detection flag 3h can be arranged for the arm support unit 6.

Figure 15:
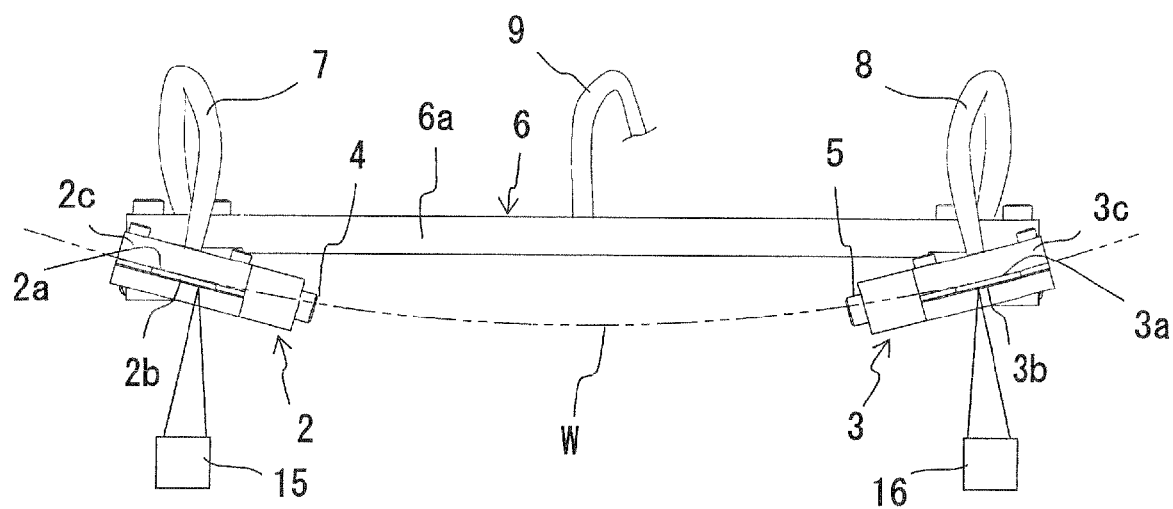
FIG. 15 is a front view of the wafer transport device according to the fifth variation example of an embodiment of the present invention.

In place of the transmission sensors 10 and 11, as illustrated in FIG. 15 (front view), another inclination detection device such as reflective sensors 15 and 16 for emitting detection beams from the lower portion to the carrying plates 2b and 3b (arm units 2 and 3), and the reflected light, thereby detecting the inclination angle of the wafer carrying surfaces 2a and 3a can be used.

When the arm units 2 and 3 are not inclined at a predetermined angle, an inserting operation of the wafer transport device 1 into the wafer cassette 22 can be stopped to give a warning.

<Wafer Check Device and Wafer Check Method>

Figure 16:
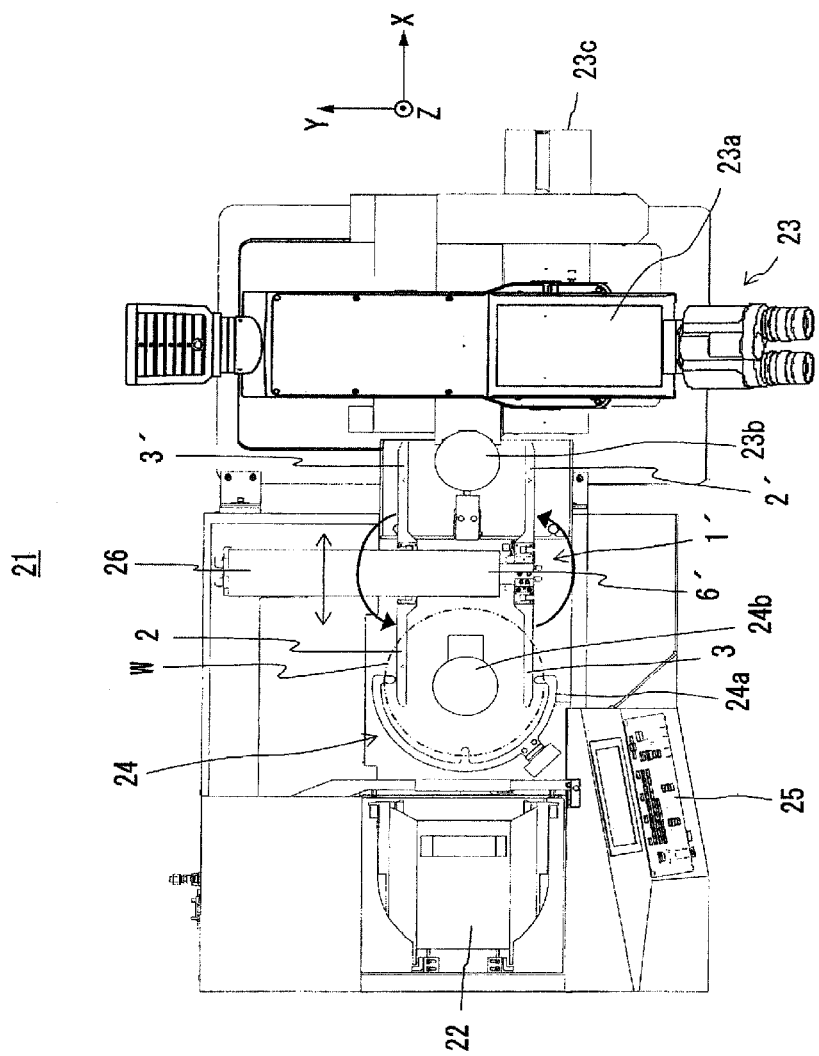
FIG. 16 is a plan view of the wafer check device according to an embodiment of the present invention.

FIGS. 16 and 17 area plan view and a front view of a wafer check device 21 according to an embodiment of the present invention.

The wafer check device 21 includes a wafer transport device 1', the above-mentioned wafer cassette 22, and a micro check unit 23 and a macro checking unit 24 (riot illustrated in FIG. 17) as check units for checking the wafer W (not illustrated in FIG. 17) transported by the wafer transport device 1', and an operation unit 25.

However, the wafer transport device 1' is provided with arm units 2' and 3' opposite the arm units 2 and 3 with the longitudinal direction (1 axis direction) of the arm support unit 6 illustrated in FIG. 1 as a line symmetry axis, and the portion configured by the arm units 2, 3, 2', 3', and the arm support unit 6' form the shape of H.

Each of the arm units 2, 3, 2', and 3' independently rotates and is inclined as described above. Furthermore, the arm support unit 6' is held from above by a drive unit 26 of the wafer transport device 1' so that the arm units 2 and 3 and the arm units 2' and 3' can rotate and vertically move about the rotation axis (Z axis) as a rotation symmetry.

In the wafer cassette 22, the wafer W supported by the periphery support unit 22a is piled in the height direction as illustrated in FIG. 8A.

The drive unit 26 moves in the X-axis direction along the rail not illustrated in the attached drawings. The position of the rotation axis (Z axis) of the arm support unit 6' for rotating the arm units 2 and 3 and the arm units 2' and 3' in the rotation symmetry has the same Y axis coordinate as the center position of the wafer W stored in the wafer cassette 22. That is, when the longitudinal direction of each of the arm units 2, 3, 2', and 3' is extending in the X-axis direction, the wafer W can be transported only by the movement of the drive unit 26 in the X-axis direction and the vertical movement of the arm support unit 6'.

The micro checking unit 23 is provided with a microscope 23a for observing an enlarged image of the wafer W, an XY stage 23c movable in the directions of two axes, and a wafer carrying table 23b for moving the wafer W in each direction of the axes X, Y, and Z, rotating the wafer W, and receiving the wafer W.

The macro checking unit 24 is provided with a oscillating mechanism 24a for oscillating the wafer W, and a wafer carrying table 24b for use in receiving and transmitting a wafer.

Described below is checking the wafer W using the wafer check device 21.

FIG. 18 is a flowchart of the wafer check method according to an embodiment of the present invention.

First, the wafer in the wafer cassette 22 is transported by the wafer transport device 1' near the macro checking unit 24 (S1).

Then, after the alignment for detection of the shift from a predetermined position of the wafer W by the sensor not illustrated in the attached drawings (S2), the wafer transport device 1' places the wafer W on the wafer carrying table 24b of the macro checking unit 24 by setting the center of the wafer W at the rotation center of the wafer carrying table 24b (S3).

In this case, the wafer transport device 1' can align the center of the wafer W with the rotation center of the wafer carrying table 24b only by the movement in the direction of one axis, that is, the X-axis direction of the drive unit 26 and the rotation on the horizontal plane of the arm support unit 6'.

That is, the amount of shift between the center position when the wafer W is held in the reference position by the arm units 2 and 3 or the arm units 2' and 3' and the center position when the wafer W is actually held and the direction are detected by the alignment (S2). Therefore, the shift in the Y-axis direction is corrected by the rotation of the arm support unit 6', and the amount of movement of the drive unit 26 is determined from the amount of shift in the X-axis direction occurring by the rotation angle and the amount of shift in the X-axis direction at the alignment.

Next, the oscillating mechanism 24*a* of the macro checking unit 24 lifts and oscillates the wafer placed on the wafer carrying table 24*b*.Then, the oscillated wafer W is visually observed (macro check) by an inspector (S4).

In this case, the wafer transport device 1' moves the arm support unit 6' downward for standby at the position where the center point of the rotation of each of the wafer carrying table 24*b* and the wafer carrying table 23*b* at the transmission and reception position matches the rotation axis (Z axis) of the arm support unit 6' by the drive unit 26. When the macro check (S4) is completed, the arm support unit 6' is lifted and the wafer transport device 1' rotates the arm support unit 6' by 180° (counterclockwise in FIG. 16), thereby exchanging the positions between the arm units 2 and 3 and the arm units 2' and 3' of the wafer transport device 1'.

The 180° rotated wafer transport device 1' lowers the arm support unit 6', and places the wafer W on the wafer carrying table 23*b* of the micro checking unit 23 (S5). Then, while appropriately moving and rotating the wafer by moving the XY stage 23*c*,it observes (micro check) an enlarged image of the wafer using the microscope 23*a* (S6). When the micro check is completed, the XY stage 23*c* is moved to the transmission and reception position.

When the wafer transport device 1' lifts the arm support unit 6' and rotates it by 180°, the positions of the arm units 2 and 3 and the arm units 2' and 3' are exchanged with each other. The wafer transport device 1' lowers the arm support unit 6', and the wafer W is placed on the wafer carrying table 24*b* of the macro checking unit 24 (S7).

Another wafer W treated in the processes up to the above-mentioned macro check (S4) is transported (S5) to the micro checking unit 23. Thus, the two wafers can be simultaneously checked.

Next, the shift of the wafer W on the wafer carrying table 24*b* is detected by the sensor not illustrated in the attached drawings with the wafer carrying table 24*b* rotated. Then, by rotating the wafer W by the rotation of the wafer carrying table 24*b*,the direction of the shift with respect to the wafer carrying table 24*b* of the wafer, that is, the direction from the rotation center of the wafer carrying table 24*h* to the center of the wafer W, can be aligned to the direction of the movement of the drive unit 26 (same as the direction of storage (direction indicated by the arrow in FIG. 16 as the X-axis direction)) (S9).

Next, when there is no notch in the wafer W, or when the direction of the notch, if any, is not adjusted (S9), the arm support unit 6' of the wafer transport device 1' is lifted and received as is, and the wafer is stored in the wafer cassette 22 by inserting it with the amount of shift between the wafer carrying table 24*b* and the center of the wafer W taken into account (S13).

In this case, since the direction of the shift of the wafer W matches the direction of the movement of the drive unit 26, and the longitudinal direction of the arm units 2, 3, 2', and 3' also matches the X-axis direction as the direction of the movement of the drive unit 26, it is not necessary to move the wafer W in the Y-axis direction in the wafer transport device 1'. In addition, the wafer W can be imported without a shift in the width direction of the wafer cassette 22 only by the movement in the direction of one axis in the X-axis direction of the drive unit 26 and a vertical movement of the arm support unit 6'.

On the other hand, when the direction of the notch is adjusted (S9), the arm support unit 6' of the wafer transport device 1' is lifted again to receive the wafer W, the center of the wafer W and the center of the wafer carrying table 24*b* are matched by moving the drive unit 26, and the wafer W is received by the wafer carrying table 24*b* (S10). Also in this case, since the direction of the shift of the wafer matches the direction of the movement (direction of the storage.) of the drive unit 26, the center of the wafer W and the center of the rotation center of the wafer carrying table 24*b* can be aligned only by moving the drive unit 26 in the direction of the storage (direction of the movement in the direction of one axis) and vertically moving the arm support unit 6'.

Afterwards, the notch is detected by a sensor not illustrated in the attached drawings (S11), the wafer W is rotated to align the notch in, for example, the direction of the storage (S12), and the wafer is stored in the wafer cassette 22 by the wafer transport device 1' (S13).

When all wafers are completely checked (S14), the check is terminated. If there is an unchecked wafer, the above-mentioned processes are performed again from the transport (S1) of the wafer.

In the above-mentioned wafer check device 21, the wafer transport device 1 inserts into the wafer cassette 22 the arm units 2 and 3 having the wafer carrying surfaces 2*a* and 3*a* inclined toward the horizontal plane as described above for the wafer transport device 1. Therefore, although there is warp or deformation on the wafer W piled in the wafer cassette 22, an unnecessary contact between the arm units 2 and 3 and the wafer W can be avoided. Accordingly, the risk of the damage of the wafer W can be reduced.

Additionally, since a deformed wafer W can be transported from or to the wafer cassette 22, the wafer cassette 22 can be prevented from contacting, for example, a wafer W in the stage immediately above.

In addition, the wafer check device 21 detects the shift between the center of the wafer W on the wafer carrying table 24*b* of the macro checking unit 24 and the rotation center of the wafer carrying table 24*b* by a sensor not illustrated in the attached drawings, and rotates the wafer W, thereby matching the direction of the shift of the wafer W with the direction of the movement (X-axis direction as the same direction as the direction of the storage) of the drive unit 26 (S8). Therefore, the centers of the wafer and the wafer carrying table 24*b* can be aligned (S10) or the alignment during the transport (S13) of the wafer to the wafer cassette 22 can be performed only by moving the drive unit 26 with the longitudinal directions of the arm units 2 and 3 and the arm units 2' and 3' matched with the direction of the movement (X-axis direction) of the drive unit 26.

Furthermore, a wafer is described in the present embodiment, but the embodiments of the present invention can also be applied to a large substrate such as a flat panel display etc.

What is claimed is:
1. A substrate transport apparatus, comprising:
a pair of arm units each having a substrate-carrying surface on which a substrate is placed;
a support member which freely rotatably supports the arm units; and an inclination device which inclines the arm units such that the substrate-carrying surfaces thereof face one another,
wherein the substrate-carrying surface rotates about a rotation axis positioned on the substrate-carrying surface.

2. The apparatus according to claim 1, wherein the inclination device shifts the rotation axis from a barycenter position of each arm unit to outside each arm unit.

3. The apparatus according to claim 1, wherein the inclination device comprises a spring.

4. The apparatus according to claim 1, wherein the inclination device comprises a motor.

5. The apparatus according to claim 1, wherein the inclination device comprises a ballast.

6. The apparatus according to claim 1, wherein the arm units move to a position where the substrate is placed with the substrate-carrying surfaces thereof inclined.

7. The apparatus according to claim 1, further comprising:
suction tubes respectively connected to corresponding ones of the pair of arm units,
wherein:
each of the arm units adsorbs to and holds the substrate by sucking air from its respective suction tube; and
the suction tubes are connected to their respective arm units in a direction different from the rotation axis of the substrate-carrying surface.

8. The apparatus according to claim 7, wherein the suction tubes are connected to their respective arm units in a direction orthogonal to the rotation axis of the substrate-carrying surface.

9. The apparatus according to claim 7, further comprising an arm support unit supporting the arm units, wherein the suction tube connects the arm support unit to the arm unit.

10. The apparatus according to claim 1, further comprising:
suction tubes respectively connected to corresponding ones of the pair of arm units,
wherein:
each of the arm units adsorbs to and holds the substrate by sucking air from its respective suction tube; and
the suction tubes are connected to their respective arm units in a position of an offset from the rotation axis of the substrate-carrying surface.

11. The apparatus according to claim 1, further comprising an inclination detection unit which detects an inclination of the substrate-carrying surface.

12. The apparatus according to claim 1, further comprising a rotation restriction device which restricts a rotation angle of the substrate-carrying surface.

13. The apparatus according to claim 12, wherein:
the support unit comprises a moving device; and
when the arm units are not inclined at a predetermined angle, a movement of the moving device is stopped.

14. The apparatus according to claim 12, wherein the rotation restriction device can adjust a rotation range of the substrate-carrying surface.

15. The apparatus according to claim 1, wherein the pair of arm units are provided for the support member.

16. A substrate transport method in which a substrate is transported on an arm unit, the method comprising:
moving the arm unit having a substrate-carrying surface inclined toward a horizontal plane to a position where the substrate is placed; and
placing the substrate on the inclined arm unit,
wherein the substrate-carrying surface rotates about a rotation axis position on the substrate-carrying surface.

* * * * *